United States Patent [19]

Young et al.

[11] Patent Number: 5,789,903

[45] Date of Patent: Aug. 4, 1998

[54] METHOD AND APPARATUS FOR PROCESSING BATTERIES

[75] Inventors: Malcolm Young, Strathfield; Phillip Angilley, Brookvale, both of Australia

[73] Assignee: John York Seymour, Lane Cove, Australia

[21] Appl. No.: 718,397

[22] PCT Filed: Mar. 28, 1995

[86] PCT No.: PCT/AU95/00174

§ 371 Date: Oct. 23, 1996

§ 102(e) Date: Oct. 23, 1996

[87] PCT Pub. No.: WO95/26588

PCT Pub. Date: Oct. 5, 1995

[30] Foreign Application Priority Data

Mar. 28, 1994 [NZ] New Zealand ............. 260204

[51] Int. Cl.$^6$ ............................................. H12J 7/04
[52] U.S. Cl. ................................................. 320/161
[58] Field of Search ........................ 320/13, 22, 23, 320/35, 161

[56] References Cited

U.S. PATENT DOCUMENTS

| | | | |
|---|---|---|---|
| 3,767,995 | 10/1973 | Kaminski et al. | 320/22 |
| 4,349,775 | 9/1982 | Kwon et al. | 320/35 |
| 5,061,898 | 10/1991 | Oram et al. | 324/427 |
| 5,185,566 | 2/1993 | Goedken et al. | |
| 5,196,779 | 3/1993 | Alexandres et al. | |
| 5,278,509 | 1/1994 | Haynes et al. | 324/427 |
| 5,640,079 | 6/1997 | Nelson et al. | 320/21 |

FOREIGN PATENT DOCUMENTS 0 432 690   6/1991   European Pat. Off.

*Primary Examiner*—Peter S. Wong
*Assistant Examiner*—Gregory J. Toatley, Jr.
*Attorney, Agent, or Firm*—Young & Thompson

[57] ABSTRACT

A method and apparatus for processing rechargeable batteries include using a processor arranged to monitor the voltage of a battery when it is being discharged and to terminate the discharge after detecting that the rate of change of the voltage has passed through a termination pattern indicative of exhaustion of a cell of the battery. The determination is made by monitoring the voltage during discharge and detecting when the voltage curve thereof exhibits first convexity followed by concavity. The degree of convexity and concavity, and the time interval within which they must occur, are determined by the processor. The discharge is also terminated if the voltage reaches a predetermined voltage or if, after the termination pattern is detected, and before the voltage has reached a predetermined voltage, a predetermined amount of charge is removed from the battery. The invention also envisages recharging the battery first at high rate until the amount of charge returned to the battery is no more than the charge removed from the battery before the discharge was terminated. The charge may then be continued at a lower rate until the battery is overcharged to a predetermined extent.

32 Claims, 8 Drawing Sheets

METHOD AND APPARATUS FOR PROCESSING BATTERIES

BACKGROUND OF THE INVENTION

This invention relates to a method of, and apparatus for, processing rechargeable batteries. The term "processing" applies to the conditioning of new batteries, the reconditioning of used batteries or new batteries which may have degenerated due to non-use, and also (in its broadest sense) the recharging of batteries while they are being used in a work situation. This process can be done prophylactically.

The batteries which are likely to be most commonly the subject of processing according to the invention are of the sealed nickel cadmium type although the invention may be applied to other batteries in suitable cases. Batteries of the sealed nickel cadmium sort suffer from several defects. The defects are:

(a) a tendency for the charged capacity of the battery cells to differ from each other, and for such differences to be amplified by repeated use.

(b) a tendency for the active materials of the cells to assume a less active form when the battery is not being used. Also, in the case of batteries that are not used to their fullest capacity, that part of the active material that is left unused may assume the less active form.

The battery defect known as "memory" is sometimes due to either of these defects.

(c) a tendency to produce gases during over-charge and over-discharge. The gases produced are principally hydrogen and oxygen. The cells have been designed to reuse any oxygen generated but they generally cannot reuse the hydrogen. Since the cells are sealed excessive amounts of hydrogen will cause them to vent and eventually degrade. The generation and expulsion of hydrogen from the cell may constitute an explosion hazard, and also reduce the cell capacity by causing loss of electrolyte.

The problem of uneven charged capacities among the cells of a battery can often be fixed by over-charging the battery. This procedure will be successful when it is only the charged capacity that is uneven among the cells and the intrinsic capacities of the cells are well matched. The procedure of over-charging for this purpose is known as equalisation charging.

The discharge of batteries either as part of battery processing or by use of the batteries in battery operated equipment carries certain risks when the charged capacities of the cells of the battery are not well matched. The main problem occurs when the lowest capacity cell becomes completely exhausted during discharge. If discharge continues beyond this point, the exhausted cell generates hydrogen with its associated problems. The intrinsic capacity of the cell so over-discharged may be further degraded. To reduce the likelihood of over-discharge of cells, equipment which discharges batteries is generally designed to stop discharging when the battery voltage falls to about 1 volt per cell or, for example, to 10 Volts for a 12 Volt, 10 cell battery. This procedure works well for batteries with few cells but is increasingly unreliable as the cell count grows. For batteries with larger cell counts, matching of the intrinsic cell capacities within the battery is considered essential. If the intrinsic cell matching attained during manufacture degrades due to use (or even non-use) or abuse, the battery may rapidly become ineffective or even dangerous.

In FIG. 1 of the accompanying drawings, the discharge voltage vs time of a well matched battery is shown undergoing a steady decrease in graph 1. This can be compared to graph 2 which shows the discharge voltage vs time of a battery in which one cell has lower charged capacity. The effect of exhaustion of the low capacity cell is clearly observable. The rate of decline of the voltage increases sharply at the point 3 where the voltage undergoes a sudden drop and the rate of decline then decreases sharply at the point 4 as the voltage resumes its former slow decrease.

Sealed nickel cadmium batteries may be safely overcharged by a large amount provided that the rate of charge (and over-charge) is quite low, typically below the rate of $1/10$ of the nominal capacity per hour. Fast charging at a rate of 1 nominal capacity per hour is generally considered safe provided that no cell of the battery is over-charged.

Battery processing by over-charge to equalize charged capacities of the cells of a battery (i.e. by charging them all to their intrinsic capacities) is well known. Battery processing by repeated cycling of the battery through charge and discharge cycles is commonly used to bring all of the active material in the cells to its most active form. This common practice is particularly useful for batteries that have been in storage or on continuous charge. It is known that this procedure may damage some cells.

BRIEF DISCUSSION OF THE PRIOR ART

Australian patent specification #52280/90 discloses a method and apparatus of charging a battery in which the charging is interrupted by relatively short periods of low level discharge. The battery voltage is monitored by a processor during this procedure and the gradient of the voltage curve is checked during said periods of discharge. The battery is judged to be fully charged when said gradient falls to a predetermined level, for example when it becomes negative. The charging operation is terminated at this point. The length of the short periods of discharge are preset by the processor. Furthermore, because the battery is essentially being charged in the procedure, the amount of charge removed from the battery when the procedure is terminated will, except in unusual circumstances (such as, for example, when the battery is already fully charged when the procedure is commenced), substantially exceed the amount of charge removed during said short periods of discharge.

SUMMARY OF THE INVENTION

The invention applies, in one aspect, to apparatus for, and, in another aspect, to a method of processing a rechargeable battery. It is fundamental to one form of the invention that exhaustion of a cell is detected during discharge even when the battery voltage remains above a voltage accepted as being the minimum safe voltage at which discharge should be terminated if damage to the battery is to be avoided. This is achieved, according to one aspect of the invention, by the use of processor means to determine the rate of change of the voltage of the battery when it is being discharged in the course of a discharge procedure as discussed below. This is used to detect a termination pattern in the voltage and thereafter to terminate the discharge procedure.

In contrast to the teachings of the aforementioned patent specification #52280/90, the present invention in its principle form is concerned with assessing the condition of the battery by subjecting the battery to a discharging procedure during which a discharge load is applied to the battery causing the voltage across the terminals to fall. The gradient of the battery voltage is monitored by a processor during the discharge procedure The interval over which the discharge procedure is carried out is not limited as to time-on the contrary, it is continued until the processor detects that the voltage has passed through a predetermined termination pattern which, as presently envisaged, the termination pattern will usually, but not necessarily essentially, correspond to a pattern indicative of exhaustion of a cell of the battery. The assessment of the rate of change indicating that a cell is exhausted may be made as described above with reference to FIG. 1, or in any other suitable manner.

The discharge procedure can be terminated immediately upon detection of cell exhaustion as envisaged above. However, if a small amount of extra discharge can be considered benign, normal production variations in cell capacity can be dealt with by allowing the discharge procedure to proceed beyond the point where a cell has been exhausted. The amount of extra capacity that may be discharged in this condition can be thought of as a "mismatch" allowance. When using mismatch allowance, a battery would be discharged until either a voltage chosen as a discharge termination voltage was reached (in which case the battery is considered to be well matched) or until a cell exhaustion event is detected and a further amount of charge is removed from the battery (the mismatch allowance). In any case, the discharge procedure is terminated if the discharge termination voltage is reached. The quality of the cell matching may be judged by an assessment of how much of the mismatch allowance is used before the battery voltage reached the discharge termination voltage. It should be noted here that this procedure measures the capacity difference between the lowest capacity cell and the next to lowest capacity cell or cells. A battery would be considered to be well matched if a number of cells sufficient to cause the battery voltage to fall to the discharge termination voltage become exhausted simultaneously even if there are other cells in the battery of much greater capacity.

The discharge termination voltage may be chosen to correspond to the end point voltage customarily chosen by the battery manufacturer in an effort to reduce the incidence of premature cell exhaustion on discharge. However, for the purpose of more accurately representing typical battery usage, the discharge termination voltage may be chosen to reflect the actual "turn-off" voltage of the battery powered equipment that ultimately uses the batteries.

Accordingly, in one aspect of the invention, the processor means should also be arranged to terminate the discharge procedure if, before said termination pattern is detected, the voltage reaches a value substantially corresponding to a discharge termination voltage of the battery determined by the processor; and, in another aspect of the invention, the processor means may furthermore advantageously be arranged to terminate the discharge procedure if, after said termination pattern has been detected, and before the voltage reaches said discharge termination voltage, an amount of charge determined by the processor means is removed from the battery during said discharge procedure.

One way of detecting the termination pattern is to arrange that the processor means periodically samples the voltage and compares changes therein to data indicative of known changes in the voltage of the battery when it is discharged under similar conditions.

The processor means may advantageously be arranged to differentiate the voltage with respect to time in order to determine the rate of change of the voltage.

As stated above the invention has primary application to the conditioning of new batteries and the reconditioning of used or faulty batteries. For this purpose, another use is made of the detection of the termination pattern and in particular the detection of the exhaustion of a cell. In one form of the invention, the processor means is arranged to compute the amount of charge removed from the battery. This computation may be made up until the point that the termination pattern is detected and/or, if the discharge procedure was continued thereafter, the amount of charge removed before the discharge procedure is terminated. The computation is used by the processor to determine how long the battery can safely be recharged at a high rate after discharge is terminated. As noted above, it is considered safe to charge the battery at a high rate provided that the amount of charge returned to the battery is then not substantially greater than the amount removed. The high rate of charge is set having regard, inter alia, to the need to prevent the evolution of hydrogen in the cells.

Accordingly, in one aspect of the invention, the processor means is arranged, after the discharge procedure is terminated, to cause charging means to recharge the battery first at a high rate and then at a lower rate, both rates of charge being determined by the processor means.

In one aspect of the invention the battery is charged at the high rate until the amount of charge returned to the battery is substantially equal to an amount of charge computed by the processor means as having been removed from the battery before the discharge procedure was terminated or, if the discharge procedure was continued after the termination pattern was detected, the amount of charge computed by the processor means as having been removed before the termination pattern was detected. Charging is then continued at the lower rate until the battery is over-charged to an extent determined by the processor means or as hereinafter indicated.

In one aspect of the invention the processor is arranged to reduce the rate of charge to a value determined by the processor, or terminate the charge, if while the battery is being charged the voltage exceeds a limit determined by the processor. This value and the voltage limit may be fixed and stored in the memory of the processor or may be determined during the charge process. The voltage limit may vary in response to a change of temperature in the battery. In particular, the rate of charge may be reduced and the charge ultimately terminated if the battery temperature or the rate of rise thereof exceeds a limit determined by the processor.

The reduction in the charge rate may, if necessary, be repeated with progressively diminishing rates of charge. This process has been found to be capable in many instances of restoring batteries which have been processed by conventional methods and thought to be faulty.

According to yet another aspect of the invention, applicable particularly but not necessarily exclusively to new batteries, a battery is charged at a predetermined high rate for a short initial period and thereafter at a low rate until the battery is over-charged to an extent determined by the processor. The initial period need only be long enough to ensure that the voltage of all cells is above zero and thus need not be continued for longer than a few minutes at most.

There may be commercial application for a method and apparatus for charging a battery in the above described manner (which is believed to be novel and inventive in itself) irrespective of the manner of monitoring the discharge of the battery or, indeed, whether the discharge was monitored at all.

The term "determined by the processor means" whenever it is used herein is intended to cover at least the cases in which the quantity referred to (a) has a value which is inserted by the operator and stored as data in the processor;

and (b) has a variable value which is calculated by the processor means.

In one form of the invention the apparatus is arranged to memorise, record, display or otherwise store the information concerning the battery condition which it processes during use. This information may be displayed as, for example, indicating that the battery is in good condition or not in good condition.

DESCRIPTION OF THE DRAWINGS

The invention is further discussed with reference to the accompanying drawings in which.

MODES FOR CARRYING OUT THE INVENTION

The invention comprises a method and means of processing rechargeable batteries so that their useful life may be extended or in some cases their condition is assessed so that safe disposal or repair may be done.

A discharge procedure is herein defined as a procedure which has the net effect of substantially depleting the charge within the battery.

In processing, the battery is connected to apparatus which comprises equipment designed to charge and discharge the battery in a controlled manner. The apparatus also includes equipment for recording and analysing battery voltage and other characteristics during charge and discharge. The results of the analyses are used to determine if further processing of the battery is to be carried out. The equipment includes a display device to communicate information about the battery to a person operating the apparatus. The method of processing and the related functions of the apparatus will now be discussed in detail.

Figure 2:
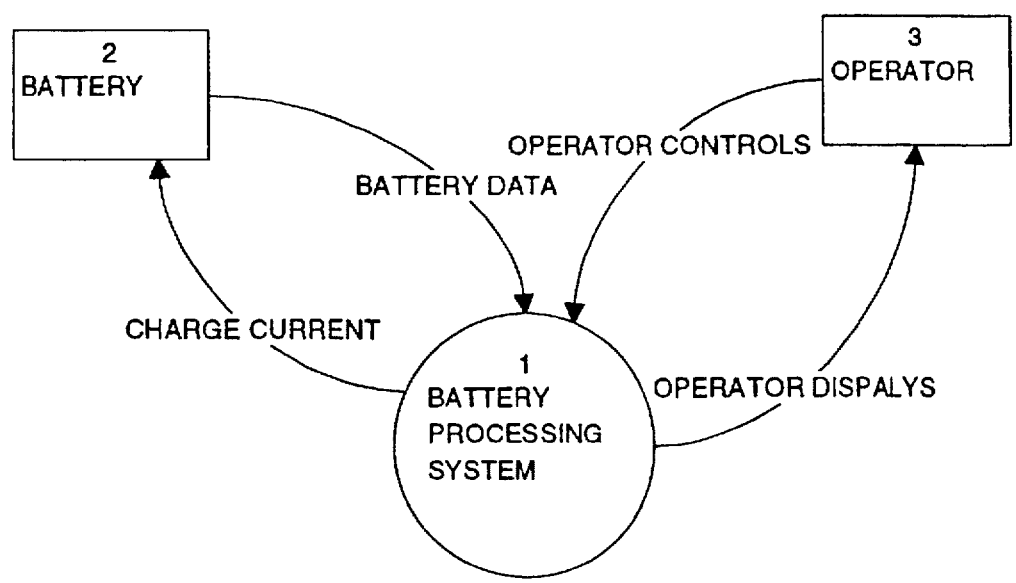
FIG. 2 is a context diagram of a battery processing system.
Figure 3:
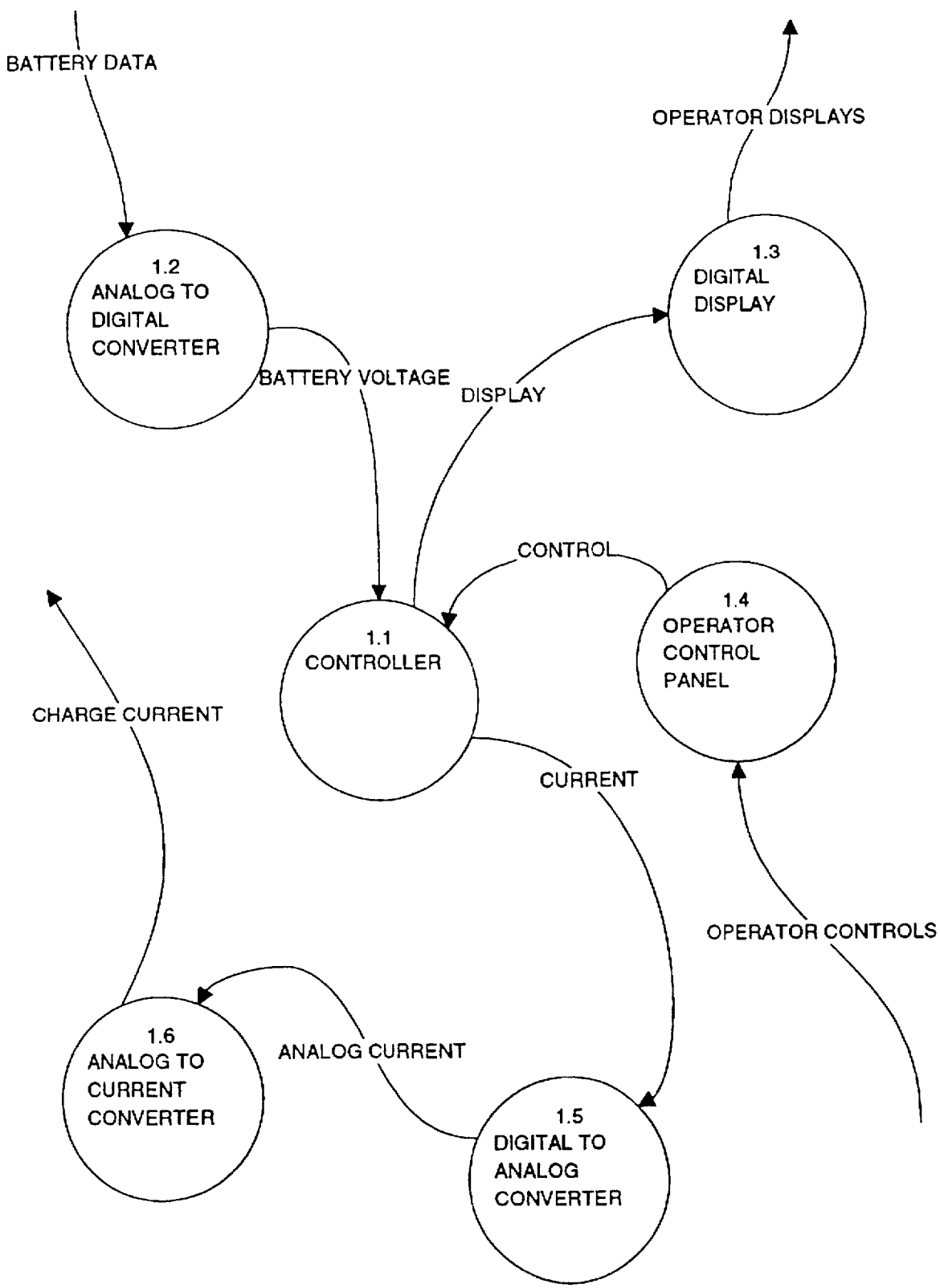
FIG. 3 is a diagram showing the flow of data in the battery processing system.
Figure 4:
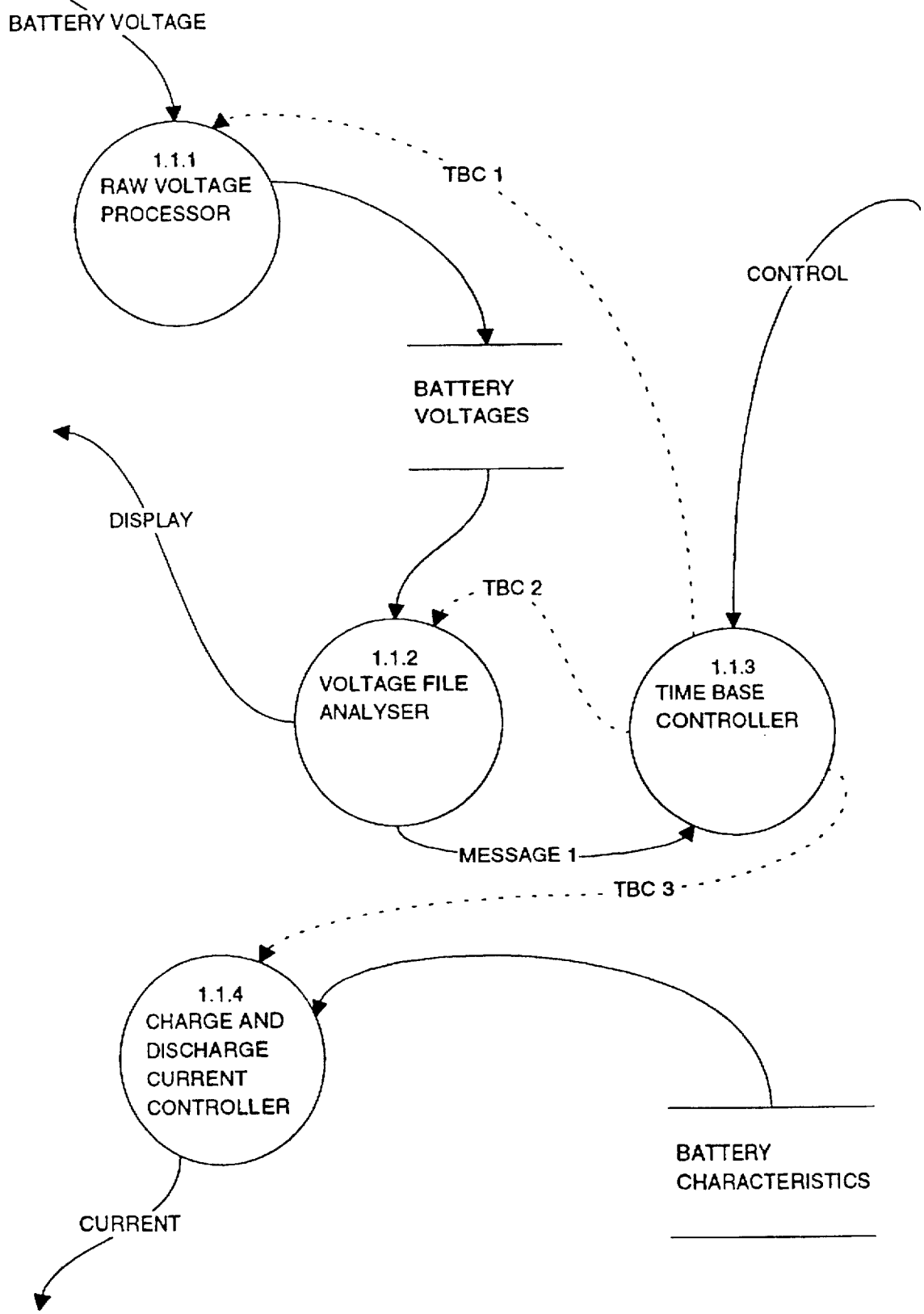
FIG. 4 is a diagram showing the flow of data in a controller forming part of the battery processing system.

Referring first to FIGS. 2 to 4

1 DESIGN AND DOCUMENTATION METHOD

The battery processing method disclosed here follows data flow design principles in order to provide a guide to implementation of the invention. The method used is based on the work of Tom Demarco as expounded in his book "Structured Analysis and System Specification" (ISBN 0-13-854380-1). Those skilled in the art of electronic equipment design, especially of equipment involving both analog and digital design, will find sufficient information here to implement the invention. If necessary, further reference may be had to the work of Demarco, Yourdon (Modern Structured Analysis ISBN 0-13-598632-X) and Hatley & Pirbhi (Strategies for Real Time System Specification-ISBN 0-932663-11-0)

2 SYSTEM DESCRIPTION

The battery processing method is best described by reference to the data flow diagrams in FIGS. 2, 3 and 4. A description of the processes involved follows. Each process described may entail both software and hardware components.

3 BATTERY PROCESSING SYSTEM (Process 1)

Figure 5:
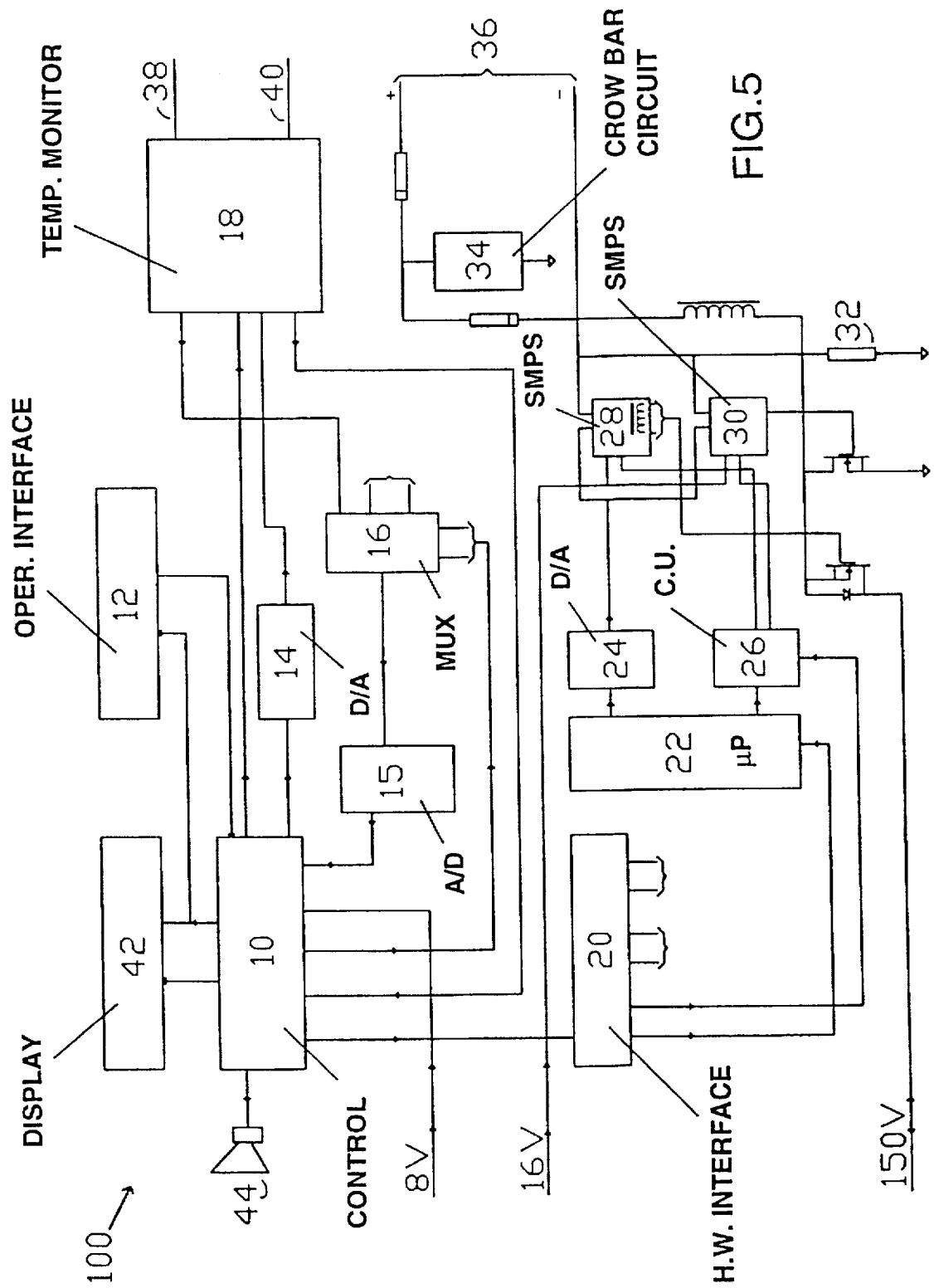
FIG. 5 is a block diagram of a charge/discharge module of the system.

The hardware which implements this system is represented in FIG. 5.

The "Battery Processing System" is indicated at 1 in FIG. 2 which represents a broad overview of the system of the invention. FIG. 2 also indicates diagrammatically the Battery 2 and the operator 3 and identifies the data flows associated with each. The data flows are described in another section. The Battery Processing System consists of several processes described here:

3.1.1 CONTROLLER (Process 1.1)

This process is carried out by controller 10 in FIG. 5. The hardware responsible for the process comprises items 14, 15, 16, 18, 12, 42 and 24 described later. The process accepts data from the Analog to Digital Converter 1.2 and the Operator Control Panel 1.4 processes (described later) and generates data flows "Display" for the Digital Display process 1.3 and "Current" for the Digital to Analog Converter process 1.5 (both described later). The Controller process 1.1 consists of several processes described here;

3.1.1.1 RAW VOLTAGE PROCESSOR (Process 1.1.1)

The hardware which implements this process comprises units 14, 15, 16 and 18 in FIG. 5. This process which takes the (digital) "Battery Voltage" data flow and on a periodic basis (as determined by process activating control flow "TBC 1") records the battery voltage in the data store "Battery Voltages". The process Raw Voltage Processor 1.1.1 may have some signal filtering and data compression capability of any commonly used sort but this is not essential to the invention.

3.1.1.2 VOLTAGE FILE ANALYSER (Process 1.1.2)

This process, which is carried out by controller 10 in FIG. 5, performs the mathematical analyses here described on a periodic basis as determined by control flow "TBC 2" and produces data flow output "Message 1" which is fed to the time base controller to affect its actions. In order to determine when to terminate the discharge of the battery as required in most forms of this invention, during the discharge process the "Battery Voltages" data store (which is updated periodically and holds a sufficient history of the voltages of the battery during processing) is examined. If the most recent voltage available is found to be less than the discharge termination voltage of the battery (as recommended by the battery maker or otherwise) the "Good" termination output message is sent to the Time Base Controller process 1.1.3 and to the Digital Display process 1.3 if required. If the recent history of the battery voltage as recorded in the "Battery Voltages" data store has the characteristic pattern associated with the complete exhaustion of a cell in the battery, the "Faulty" message is sent to the Time Base Controller process 1.1.3.

As is well known, during discharge the battery voltage falls slowly for most of the time. However, the exhaustion of a cell in the battery causes the battery voltage to fall rapidly and then to resume the (normal) slow rate of fall. This pattern of changes in voltage is recorded in the "Battery Voltages" data store and can easily be detected by any of the usual mathematical techniques. This can be achieved, for example, by detecting that dV/dt goes to a large negative value and then returns to a small negative value, where dV/dc is the time derivative of the battery voltage as calculated from the recorded values in "Battery Voltages".

This process also determines the termination of the charge process when this is based on the battery voltage (and not on time) using any of the commonly known techniques.

3.1.1.3 TIME BASE CONTROLLER (Process 1.1.3)

This process, which is carried out by controller 10 in FIG. 5, sequences the operations of the battery processor to cause the desired operations to be performed in the intended sequence. This process takes as input the operator's commands through the data flow "Control" and the result of any operations performed by the Voltage File Analyser process 1.1.2 through data flow "Message 1" and controls the operations of the battery processor through the process activating control flows "TBC 1", "TBC 2" and "TBC 3". "TBC 1" activates the Raw Voltage Processor process 1.1.1 on a periodic basis as previously described. "TBC 2" activates the Voltage File Analyser process 1.1.2 when required to perform its operations "TBC" activates the Charge and Discharge Current Controller 1.1.4 to either charge or discharge the battery. The Time Base Controller process 1.1.3 is operated as a simple state machine and as part of a control in a processor or otherwise.

3.1.1.4 CHARGE AND DISCHARGE CURRENT CONTROLLER (Process 1.1.4)

This process is carried out by controller 10 in FIG. 5 the hardware which implements the process comprises the microprocessor in the control unit 10, the microcontroller 22, the DAC 24 and the SMPS 28 or 30 for charge or discharge respectively.

This process consists of two independent processes: one to charge the battery and the other to discharge the battery. These processes are conceptually simple and are not further described in the data flow diagrams. Each of these processes is activated independently by separate components of the control flow "TBC 3" and when active charge (or respectively discharge) the battery at the current determined by preset values stored in data store "Battery Characteristics". The output data flow of this process sets the charge or discharge current via the Digital to Analog Converter 1.5 and Analog to Current Converter 1.6.

3.1.2 ANALOG TO DIGITAL CONVERTER (Process 1.2)

This process takes the analog data flow and processes it to produce the data flow "Battery Voltage". The processing, involved consists of input buffering of the usual sort for data gathering followed by conversion of the analog values to digital form. The resolution used corresponds to about 15 bits.

A 12 bit digital to analog converter sets the starting voltage of a narrow window of voltages which is converted by a 8 bit analog to digital converter to digital form. The actual voltage is calculated by the microprocessor from the setting of the window DAC and the converted value from the ADC.

A conversion rate of one conversion every three seconds is adequate.

This process is implemented by items 14, 15, 16 and 18 in FIG. 5.

3.1.3 DIGITAL DISPLAY (Process 1.3)

This process, which is implemented by unit 42 in FIG. 5, takes the data flow "Display" and converts is to human readable form (for example in L.E.D. display format) and does the actual display operation.

3.1.4 OPERATOR CONTROL PANEL (Process 1.4)

This process, which is implemented by unit 12 in FIG. 5, is the interface to the operator of the equipment. The process converts the operator's actions into a form suitable for controlling the battery processor. The process could conveniently entail the use of rotary or push button switches or keyboards.

3.1.5 DIGITAL TO ANALOG CONVERTER (Process 1.5)

This process, which is implemented by unit 24 in FIG. 5, takes the output of the Controller 1.1 as data flow "Current" which is in digital form and converts it to analog form. The analog form data flow resulting is "Analog" current which goes to the Analog to Current Converter process 1.6. Depending on the batteries used and the application, 8 to 12 bits of resolution may be required.

3.1.6 ANALOG TO CURRENT CONVERTER (Process 1.6)

This process, which is implemented by units 28 and 30 for charge and discharge respectively, in FIG. 5, takes the "Analog Current" data flow (which can represent both discharge and charge currents, though not simultaneously) and sets the charge (or respectively discharge) current to the value represented. The actual current source (or respectively sink) would take typically a linear or switch mode form as determined by the application power required. In either case, the design follows conventional lines.

4. DATA DESCRIPTION

The data flows, control flows and stores represented on the data flow diagrams are described here.

4.1 BATTERY DATA

This process is implemented by control unit 10 in FIG. 5.

This is a continuous analog data flow, specifically, the voltage of the battery being processed.

4.2 OPERATOR CONTROLS

This process is implemented by unit 12 in FIG. 5.

This is a discrete data flow being the operator selection of the battery processor operations.

5 OPERATOR DISPLAYS

This is a discrete data flow, specifically the output of the processor as seen by the operator. It includes but is not limited to the display of the GOOD or FAULTY conditions.

The process is implemented by unit 42 in FIG. 5.

6 CHARGE CURRENT

This is a continuous analog data flow being the charge (or discharge) battery current.

The process is implemented by units 28 or 30 in FIG. 5.

7 BATTERY VOLTAGE

This process is implemented by unit 10 in FIG. 5.

This is a continuous digital data flow being the digital version of the "BATTERY DATA" flow.

8 DISPLAY

This is a discrete data flow being the digital signals that drive the operator display.

The process is implemented by unit 42 in FIG. 5.

9 CONTROL

This discrete digital data flow is the digital representation of the operator's data flow "OPERATOR CONTROL", and is implemented by control unit 10 in FIG. 5.

10 CURRENT

This process is implemented by the control unit 10 in FIG. 5 and is a continuous digital data flow being the digital value of the current to be charged or discharged.

11 ANALOG CURRENT

This is a continuous analog data flow being the analog of the digital flow "CURRENT", implemented by the control unit 10 in FIG. 5.

12 CHARGE CURRENT

This is an analog current flow determined by the analog value "ANALOG CURRENT", implemented by units 28 or 30 in FIG. 5.

13 BATTERY VOLTAGES

This process is implemented by the control unit 10 in FIG. 5.

This is a data store and data associated data flow and consists of an array of digital voltage values. The array could be 200 elements by 16 bits per element.

14 TBC 1

This is a process activating control flow that causes the storage of voltage values in the "BATTERY VOLTAGES" store. The activation rate could conveniently be ⅟₄ Hz.

15 TBC 2

This is a process activating control flow that causes the voltage analysis of VOLTAGE FILE ANALYSER process 1.1.2 to be done.

16 TBC 3

This is a process activating control flow that is used to activate any controlled sub-processes in the CHARGE AND DISCHARGE CURRENT CONTROLLER process 1.1.4. It might for example start the charge or the discharge operations. If pulse charging or discharging is implemented, this signal will time the pulsing.

17 MESSAGE 1

This discrete data flow can take at least the values GOOD and FAULTY and is used to transfer the result of the processing in the Voltage File Analyser 1.1.2 to the Time Base Controller process 1.1.3 to affect the state machine operating in the process.

The processes TBC 1, TBC 2, TBC 3 and MESSAGE 1 are implemented by the control unit 10 in FIG. 5.

18 BATTERY CHARACTERISTICS

This data store holds the information relating to the required charge and discharge currents for the battery being processed. It may be loaded during manufacture or just before use, it may use volatile, reprogrammable or permanent storage mechanisms depending on system requirements.

Referring now to FIG. 5, the apparatus 100 for processing batteries comprises a control unit 10 which provides the central control operation and is responsible for implementing all significant control decisions and carrying out all necessary calculations. The unit contains RAM, EPROM and a microprocessor arranged in a standard configuration. In the present instance, the microprocessor is a Motorola type 68HC 11F1 which carries out instructions held in EPROM Intel type 27C512. The voltages read from the battery are kept in RAM memory Hitachi type 62256.

SPECIAL FUNCTIONS OF CONTROL

In addition to other functions discussed below, the control unit 10 carries out the special functions required in the processing of the batteries.

In relation to terminating the charging or discharging of the battery, the control unit maintains a record of battery voltages recorded during the discharge (or charge) procedure. This record is taken, in the present example, every 3 seconds and is smoothed to remove unimportant changes. The data is compressed to reduce the amount requiring to be stored. Control unit 10 examines the record and looks for certain features therein. This operation involves a numerical analysis of the data in the record which is carried out digitally by the unit 10. It is however best explained by treating the record as an analog graph of the discharge (or charge) voltage over time. It will be understood by those skilled in the art that the record is an internal representation of this graph.

Specifically, for detection of exhaustion of a cell, the control unit seeks what may be described as a "termination pattern" in the voltage/time graph. In the present example the control unit differentiates the voltage with respect to time and seeks two features. First the graph must exceed a predetermined degree of convexity exhibited where the measured battery voltage falls below a tangent to the voltage/time graph, the tangent having being found at some earlier time. Within a certain time thereafter, the graph must exceed a predetermined degree of concavity exhibited where the measured voltage is above a tangent to the voltage graph, the tangent again having been found at some earlier time, but after the detection of the required convex condition. In all cases the conditions sought must exist for a sufficient time and to a sufficient degree to be considered to have occurred. It is the patterns of convexity followed by concavity as aforesaid that constitutes the determination of cell exhaustion. In this determination several detection criteria operate concurrently. The detection parameters are set on the basis of battery behaviour which is known or which has been previously determined by experiment. Typically the parameters are established by averaging the recordings of the voltage/time graph previously taken of a number of batteries of similar capacity discharged under similar conditions. However such data is established, it is stored in the memory of the control unit.

The method of detecting the termination pattern is not necessarily limited to that described in the preceding paragraph. The rate of change of the battery voltage could, for example, be determined by sampling the voltage at regular intervals and comparing the voltage measured in each interval with the voltage measured in the preceding interval or in a number of preceding intervals. This also involves, effectively, a differentiation of the voltage/time data.

For example, batteries are commonly rated with reference to a "discharge time" which is typically about 5 hours and is the time which a fully charged battery takes to become completely exhausted under a given load. It is also common to judge that a cell has reached exhaustion if, in a period of a predetermined percentage (typically 1%) of the discharge time, the voltage of the battery drops by an amount of the order of the voltage of one cell under the same load. The termination pattern could typically be selected to coincide with the voltage/time graph of the battery discharged under the same conditions when a cell becomes exhausted.

Referring again to FIG. 5, item 12 indicates a set of operator controls which are part of the operator interface. They consists of several selector switches and a push button that are used to indicate the operator's instructions to the control unit 10. The operator controls are connected to an LED display unit 42 by an LED/switch interface, not shown.

The processing apparatus comprises a 12 bit digital to analog converter 14 which sets the voltage window for the voltage measurement of the battery. MUX unit 16 is used in conjunction with the analog to digital converter 15 to measure the battery voltage. Specifically, this unit is used to select which battery is to be measured. The operation of the MUX under the control of the microprocessor in the control unit 10.

Unit 18 is a front end voltage/temperature monitor which provides analog level shifting, filtering and amplification functions to convert the battery voltage inputs to a form suitable for use by the analog to digital converter and the MUX. This unit performs its assigned function on the battery voltage by buffering and level shifting with an input from the digital to analog converter 14. Unit 18 converts the (temperature dependent) resistance characteristic of a thermistor placed in the battery to a temperature reading using a resistor/capacitor time constant circuit in conjunction with a digital timer in the microprocessor 10.

Unit 20 provides the hardware interface to the charge assemblies. Up to 3 charge assemblies can be connected via this unit. The main functions of the unit are buffering of signals to and from the charge assemblies. Each charge assembly is controlled by microcontroller 22. Control information is sent to microcontroller 22 via unit 20 from the microprocessor 10. Current readings and status are returned to controller 10 via unit 20 from microcontroller 22. During both charging and discharging the microcontroller 22 sends a digital signal of the required current to the digital to analog converter 24. The DAC 24 has a voltage output which is passed to the voltage to current converter 28 and 30.

Control Unit 26 takes signal from the microcontroller 22 to enable the voltage to current converter 28 or 30. This circuit also prevents the simultaneous operation of charge 28 and discharge 30.

Item 28 is an SMPS which operates in the buck mode and charges the battery from the 150V d.c. supply. The output current is set by the converter 24 and is measured for this setting by a current sense resistor 32.

Item 30 is an SMPS which operates in the flyback mode and discharges the battery by taking power from the battery and converting this to 150V d.c. power to be reused by other modules or dumped by a power dump circuit, not shown. This discharge current is set by the converter 24 and is measured for this setting by the current sense resistor 32.

The apparatus includes a crowbar circuit 34 which, with its associated fuses, is used to improve the safety of the unit by preventing dangerous voltages from appearing on the output terminals of the charger. In the event of some internal failure in the charger, the crowbar circuit acts independently to clamp any such dangerous voltages, perhaps resulting in the breaking of the fuses.

Figure 8:
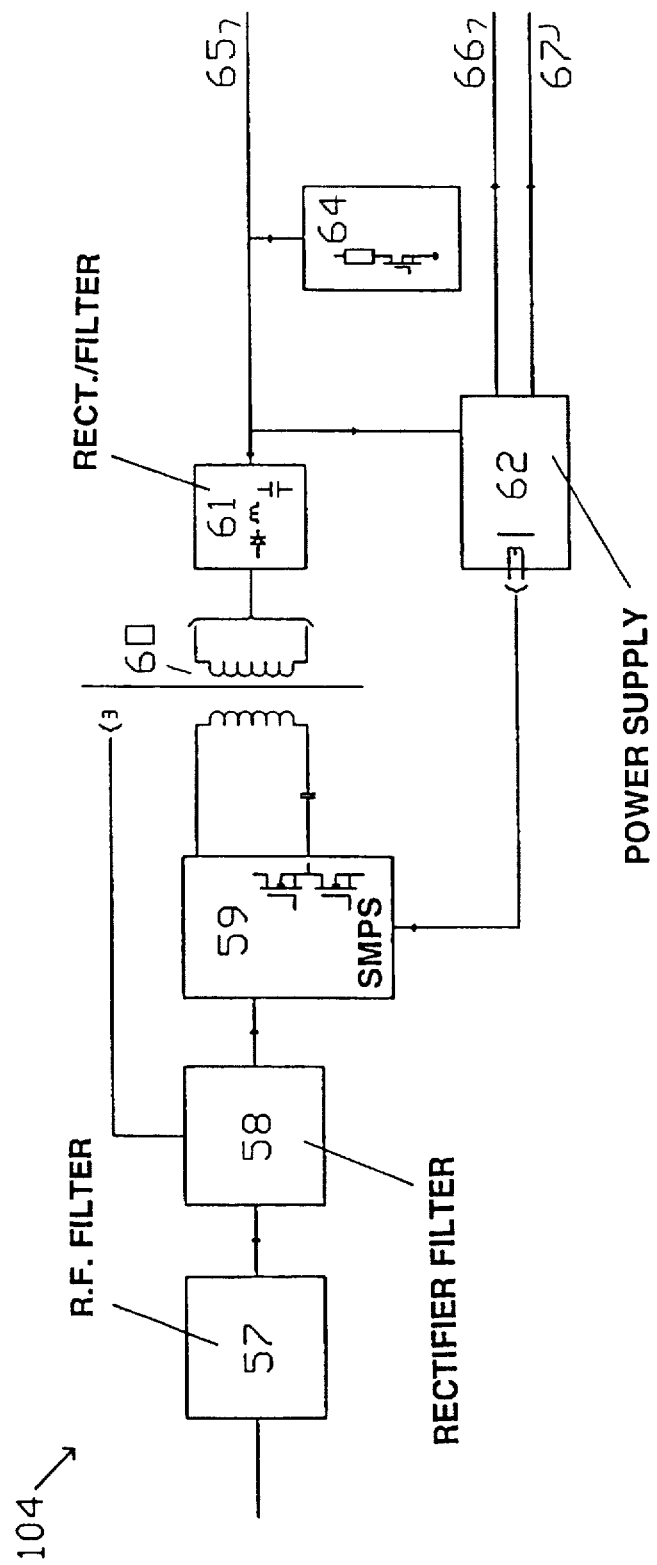
FIG. 8 is a block diagram of a power supply.

The power module 104 shown in FIG. 8 handles the conversion of the input mains power to a usable form and where necessary performs safety isolation of other modules from the potentially dangerous mains voltages. This module can operate either from 110 V or 240V a.c. sources.

Item 57 is RFI filter unit used to prevent unacceptable levels of interfering signals that may be generated by the power supply operation from appearing on the mains input. This unit is necessary to meet formal requirements of the testing and approval authorities and does not affect charger operation.

Item 58 is a rectifier/filter which converts the a.c. power input to the d.c. form and filters the resulting d.c. so as to be suitable for later processing. This unit is also responsible for handling 110V and 240V a.c. mains inputs by being used in the voltage doubler or bridge modes respectively.

Numeral 59 indicates a half bridge SMPS which takes the d.c. output of unit 58 and by a process of supersonic chopping and the use of the connected transformer 60 converts the input power to 150V d.c. The 150V d.c. appears on the output of the rectifier and filter unit 61. This unit takes the chopped output of unit 59 (as transformed by transformer 60) and converts it to smooth 150V d.c. for subsequent use by the charge modules. The 150V output appears at 65.

Unit 62 generates an 8V and 16V d.c. output to supply low level power for the control of the battery processing. This unit also provides voltage feedback for the half bridge SMPS to allow stabilisation of the 150V d.c. output. The 8V and 16V outputs appear at 66 and 67 respectively.

The power dump circuit 64 is connected to the 150V d.c. power output and is used to dissipate power that is discharged from batteries being processed. The charger will attempt to use the power discharged from batteries (to charge other batteries for example) but any excess is handled by this unit. The unit functions simply by connecting a power resistor across the nominal 150V power supply when the voltage of that supply exceeds about 160V.

Figure 6:
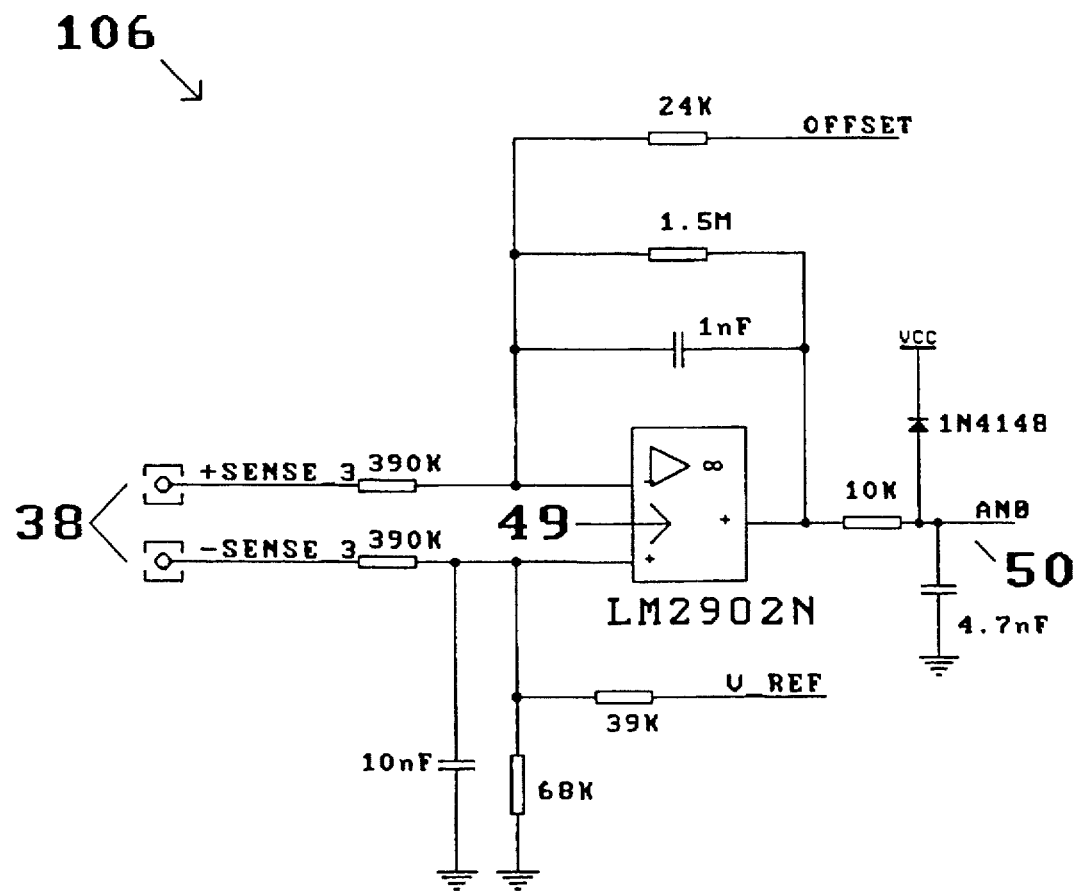
FIG. 6 is a diagram of a voltage sensing circuit.
Figure 7:
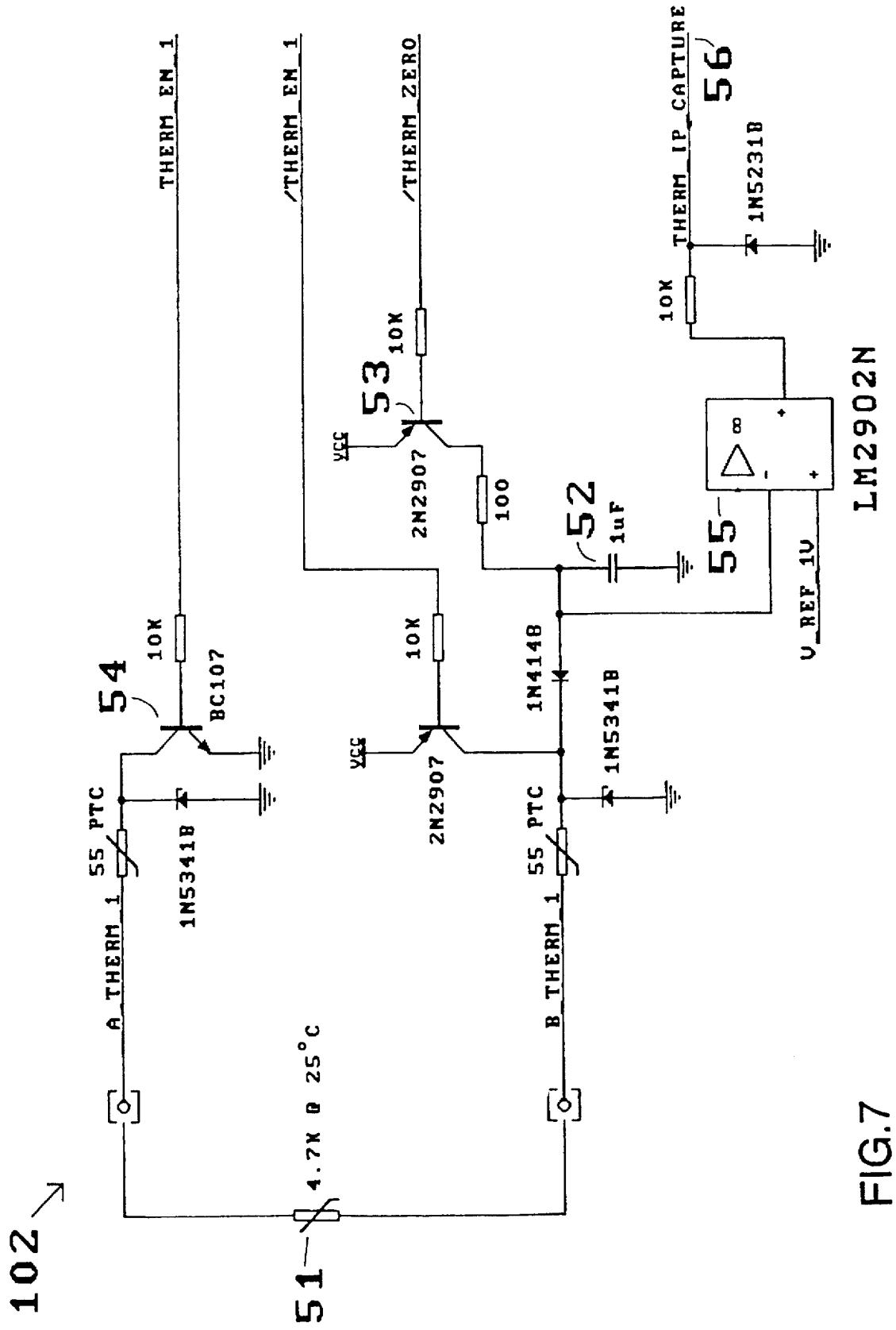
FIG. 7 is a diagram of a temperature sensing circuit.

The voltage sensing circuit and the temperature sensing circuit which are used in the unit 18 of the processor are shown in FIGS. 6 and 7 respectively. The circuits are conventional as will be understood by those skilled in the art. The input terminals 38 of the voltage sensing circuit 106 are connected to the battery and the output 50 is connected to the microprocessor in the control unit 10. The operational amplifier 49 is a LM2902N device available from the Motorola company.

The temperature sensing circuit 102 shown in FIG. 7 is a simple resistor/capacitor (RC) timing circuit. The temperature is calculated by measuring the time taken for the external temperature dependent resistance characteristic of the thermistor 51 to discharge the timing capacitor 52. The conversion process is controlled by the microprocessor. First the timing capacitor 52 is charged by transistor 53. Second, transistor 53 is turned off, transistor 54 is turned on and an internal timer is started. The external thermistor 51 discharges timing capacitor 52 until the voltage at the input to voltage comparitor 55 (also a LM2902N) reaches a preset level. At this time the signal at the output 56 is passed to the microprocessor in control unit 10 to stop the internal timer. The elapsed time is then used to calculate the temperature.

A typical processing session in which a battery is discharged and its cell balance reported using the above described processor will now be described. The battery is connected to charging output terminals 36 of the charger. The battery is also connected to inputs 38 and 40 of unit 18 for monitoring battery voltage and temperature respectively. The operator then selects the required procedure using the operator controls 12 and confirms correct commencement of the procedure by viewing the LED display 42. A buzzer 44 may also confirm commencement of the operations. The control unit 10 would then send signals to the converter unit 22 that would have the effect of setting the appropriate discharge current for the flyback SMPS unit 30 via the digital to analog converter 24. The signals from control unit 10 also instruct the control logic unit 26 to commence operations of the flyback SMPS thus commencing discharge of the battery. At the same time the control unit 10 via MUX 16 and ADC 15 records the battery voltage every 3 seconds. The control unit 10 examines the battery voltage record and seeks a termination pattern in the voltage as described above, indicating complete exhaustion of a cell.

Concurrently with these operations, the instantaneous battery voltage is monitored. If the instantaneous battery voltage falls below a predetermined discharge termination voltage, the discharge is terminated. The termination voltage is stored in the control unit and may be the end point voltage recommended by the battery manufacturer. If the termination pattern is found, and the battery voltage remains above the termination voltage for a time longer than the mismatch allowance stored in the control unit, the discharge is terminated and the battery is indicated as being mismatched. The degree of mismatch may be estimated from measured times and displayed. Alternatively, the bare fact of unacceptable mismatch may be displayed. In either case, discharge operations are terminated and the operator is alerted to the events by buzzer 44 and informed of the results by the display 42.

The control unit computes the amount of charge which is removed from the battery until the termination pattern is reached and also, if discharge is continued beyond that point, until the discharge is terminated. This information is stored in the memory control unit.

The following is a description, by way of example, of a typical processing session in which a battery is charged using the processor as described with reference to FIG. 5. It is assumed for this example that the processing is carried out on a battery of 1.0 Ampere hour capacity consisting of 20 cells of the nickel-cadmium sealed type.

The session would start with what may be called a forming charge. This is a charge where the battery receives current mostly at a slow rate. For the purposes of this example this may be considered to be a rate which would fully charge a completely discharged battery in a period of 10 hours. The forming charge might however also include a short period of high current charge.

The forming charge could be carried out as follows. The battery is connected to the terminals 36, 38 and 40 of the processor as described above. The processor is connected to the power supply 104 shown in FIG. 8. The processor passes a current of 1.0 Ampere through the battery for a period of 20 seconds. Following this, the processor adjusts the charging current of 0.1 Ampere and this current is passed through the battery for a period of 20 hours. This is done with the intention of ensuring that all 20 cells in the battery have received a complete charge. The cells of the 1.0 Ampere hour sealed type battery are designed to operate without damage for long periods with a charge current of 0.1 Ampere and are therefore not damaged by this process. It should be noted here that while the nominal capacity of these cells is 1.0 Ampere hour, due to manufacturing tolerances and allowances for degradation in use, the actual capacity of the cells of the battery could typically be in excess of 1.3 Ampere hour. The capacity charged in this forming charge is therefore about 2.0 Ampere hour. The additional charging (over the aforementioned 1.3 Ampere hour actual capacity) is required to account for the less than 100% charge efficiency that is typical of these cells especially when just taken from storage. The important aspect of this forming charge is not the timings but the inclusion of a short initial period of high current (in this case 1.0 Ampere for 20 seconds) which has been found in experiments carried out in connection with the invention to cause some cells that were otherwise refractory to accept the subsequent slow charge.

The forming charge is typically followed by a discharge of the battery as described above. The processor might be set to a (discharge) current of 0.2 Ampere. The current of 0.2 Ampere is chosen as this is a standard discharge current measuring the capacity of the type of cell chosen for this example. Other standards could be used or other currents chosen for convenience. As the discharge of the battery proceeds, the processor records and memorises the battery terminal voltage at regular intervals (say every 3 seconds) and the values so read are internally graphed against expired time. Readings taken continuously or at other intervals would not materially change the invention. As noted above, by differentiation of the graph, the processor is able to detect a termination pattern in the voltage indicating the exhaustion of a cell. Typically, the exhaustion of a single cell of the battery would result in a rapid fall of the battery voltage by an amount of approximately 1/20 of the battery voltage (for the 20 cell case). This fall would typically take place over a period of about 3 minutes.

Figure 1:
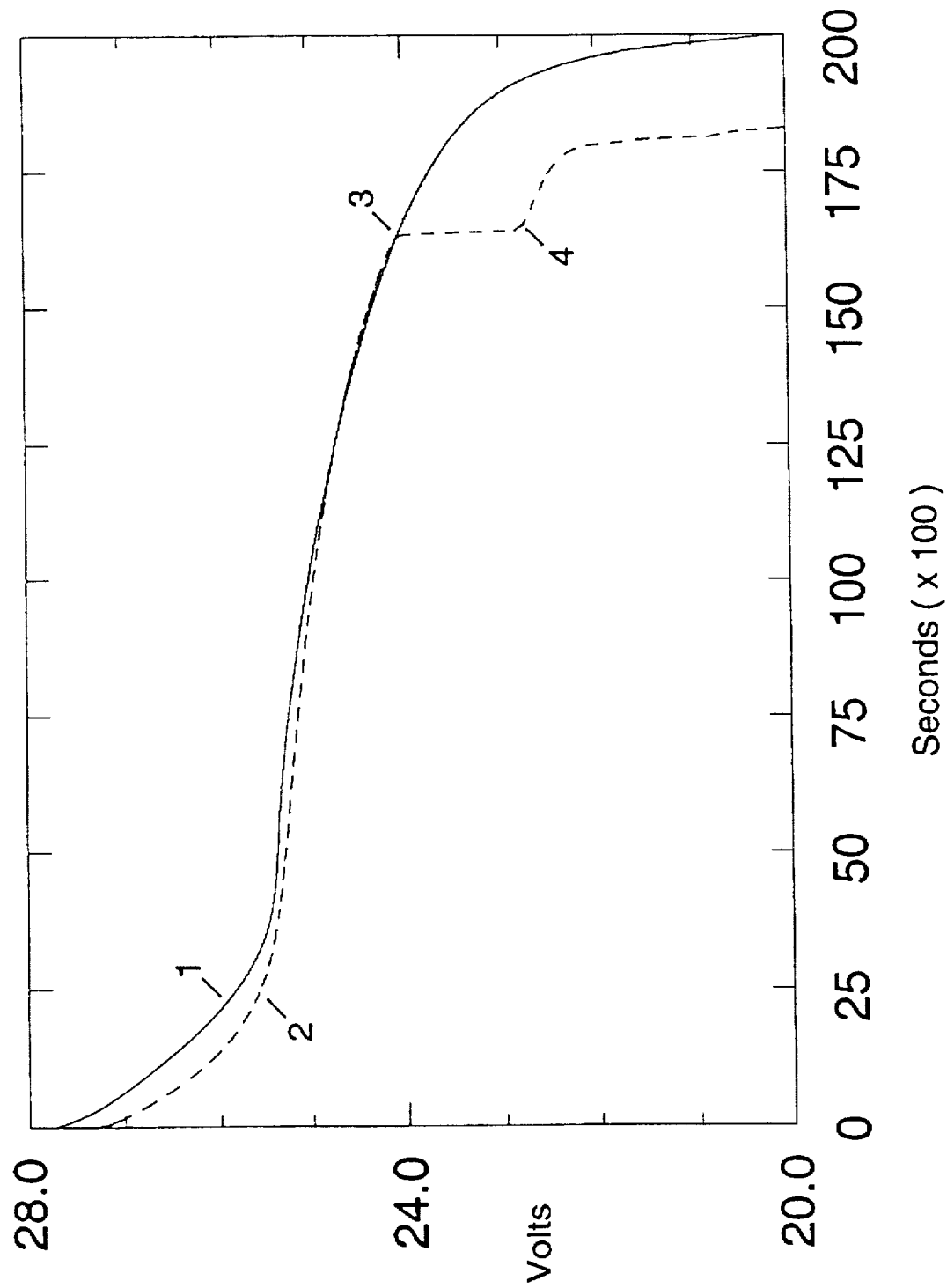
FIG. 1 is a graph depicting discharge patterns.

The discharge may be terminated at the point where exhaustion of the cell is detected as described above with reference to graph 2 in FIG. 1. However, the discharge may be allowed to continue past that point by a predetermined amount equal to the mismatch allowance. Batteries are commonly rated by the manufacturers as being matched (as regards their cell capacities) to within a given percentage. For a battery so rated at, for example, 5%, the mismatch allowance might typically be set at 8% of the nominal capacity of the battery. In this example, an amount of charge equal to 8% of the nominal capacity of the battery will be removed after detection of cell exhaustion.

Uncontrolled repeated continuation of the discharge beyond the point of exhaustion of one or more cells in a battery containing badly matched cells carries a risk, inter alia, of permanent degradation of battery performance. The risk of damage to a battery is dependent on a variety of factors including battery construction and the use which is made of the battery. For example, the use of a battery on equipment which discharges the battery beyond recommended end point voltage can increase cell mismatch and knowledge of such use and/or of the battery construction may influence the choice of mismatch allowance. A higher chosen tolerance of cell mismatch can allow improvement in some suspect batteries, albeit at a greater risk of further cell damage. The invention provides a means of early identification of increasing cell mismatch and a more reliable method of restoring batteries to useful service with minimised cell mismatch than has hitherto been the case.

In any case, the discharge of the battery is also terminated if the battery voltage reaches a predetermined discharge termination voltage. In the present example the discharge termination voltage is assumed to be 20.0 Volt. If a cell exhaustion is detected and the battery is further discharged by the mismatch allowance without the battery voltage falling below the discharge termination voltage then it may be considered that the battery is FAULTY. This is because of the mismatch in cell capacity.

It has however been found, in processing batteries according to the system of the present invention, that some batteries may improve in matching if charged and discharged several times.

Following the discharge process, the battery may be recharged. In general, it is safe to rapidly recharge a battery of the type used in this example provided that the charge which is put into the battery does not exceed its uncharged capacity. As the battery has just been discharged by an amount which was computed by the processor, it is safe to replace the amount of charge that has been removed in the previous discharge. This is true irrespective of whether the discharge detected a cell mismatch or not. So to save time the battery might be recharged using the power supply set to 1.0 Ampere and timed to replace no more charge than has been removed during the discharge process. In general a small amount of additional charge can be given at the fast charge rate but significant over-charge at this rate may damage the battery.

Following this timed fast charge the battery might then be further charged by the control unit setting the power supply to 0.1 Ampere and completing the charging process so that (typically) a total of 140% of the battery's nominal capacity is replaced. The charge returned to the battery in excess of its nominal capacity has two principle functions. First, the charging process is not 100% efficient so that the battery must be charged to over 100% to achieve 100% return. Second, the cells of the battery may be unmatched in a variety of characteristics (eg charge efficiency) and applying excess charge tends to improve matching.

In using or processing a battery, it may be repeatedly charged and discharged substantially as described above. Typically, the state of the battery after the most recent discharge is considered to indicate the quality of the battery. The exact number of repeats of the discharge/charge process is not important but as this process is a lengthy one, large numbers of repeats would be a disadvantage. A system in which a forming charge is applied followed by one discharge process and one charge process would be typical for a sound battery.

If during the charging process either the battery voltage or the battery temperature reach an upper limit determined by a value stored in the processor, the charging is terminated or the processor may switch to a lower rate of charge. The voltage limit may be reduced and the charge ultimately terminated if the battery temperature or the rate of rise thereof exceeds a limit determined by the processor. Commonly, battery manufacturers set a limit of $1.55^V$ per cell at 15° C. This limit might typically be reduced to 1.505V at 26° C.

The aforementioned switching can be continued until the battery is fully charged.

The invention is not necessarily limited to detection of a termination pattern in the rate of change of the voltage indicative of cell exhaustion. An operator might conceivably wish to terminate the discharge in other circumstances which can be detected by an analysis of the rate of change of voltage.

It is not intended that the scope of a patent granted in pursuance of the application of which this specification forms a part should exclude modifications and/or improvements to the embodiments described and/or illustrated which are within the spirit of the invention as defined herein or be limited by details of such embodiments further than is necessary to distinguish the invention from the prior art.

We claim:

1. Apparatus for processing a rechargeable battery, comprising processor means for monitoring the rate of change of voltage of the battery when it is being discharged in the course of a discharge procedure in which its charge is substantially depleted and for terminating the discharge procedure after detecting that the voltage has passed through a termination pattern determined by the processor means with reference to said rate of change.

2. The apparatus according to claim 1, wherein said termination pattern corresponds to a pattern indicative of exhaustion of a cell of the battery.

3. The apparatus according to claim 2, wherein said processor means terminates the discharge procedure if, after said termination pattern is detected and before the voltage reaches said discharge termination voltage, an amount of charge determined by the processor means is removed from the battery during said discharge procedure.

4. The apparatus according to claim 1, wherein said processor means detects the termination pattern by periodically sampling the voltage and comparting changes therein to data indicative of known changes in the voltage of the battery when it is discharged under similar conditions.

5. The apparatus according to claim 1, wherein said processor means differentiates the voltage with respect to time in order to determine the rate of change of the voltage.

6. The apparatus according to claim 1, wherein said processor means causes, after the discharge procedure is terminated, charging means to recharge the battery first at a high rate and then at a lower rate, both rates of charge being determined by the processor means.

7. The apparatus according to claim 6, wherein the battery is charged at the high rate until the amount of charge returned to the battery is substantially equal to an amount of charge computed by the processor means as having been removed from the battery before the discharge procedure was terminated or, if the discharge procedure was continued after the termination pattern was detected, the amount of charge removed until the termination pattern was detected.

8. The apparatus according to claim 6, wherein said processor means reduces the rate of charge to a value determined by the processor means if while the battery is being charged the voltage reaches an upper limit determined by the processor means.

9. The apparatus according to claim 8, wherein said upper limit varies in response to changes in the temperature of the battery.

10. A method of processing a rechargeable battery comprising the steps of providing processor means which are arranged to monitor the rate of change of voltage of the battery when it is being discharged in the course of a discharge procedure in which its charge is substantially depleted and to terminate the discharge procedure after detecting that the voltage has passed through a termination pattern determined by the processor means with reference to said rate of change.

11. A method according to claim 10, wherein said termination pattern corresponds to a pattern indicative of exhaustion of a cell of the battery.

12. A method according to claim 11, wherein the processor means is arranged to terminate the discharge procedure if, after said termination pattern is detected, and before the voltage has reached said discharge termination voltage, an amount of charge determined by the processor means is removed from the battery during said discharge procedure.

13. A method according to claim 10, wherein the processor means is arranged to detect said termination pattern by periodically sampling the voltage and comparing changes therein to indicative of known changes in the voltage of the battery when it is discharged under similar conditions.

14. A method according to claim 10, wherein the processor means is arranged to differentiate the voltage with respect to time in order to determine the rate of change of the voltage.

15. A method according to claim 10, wherein the processor means is arranged, after the discharge procedure is terminated, to cause charging means to recharge the battery first at a high rate and then at a lower rate, both rates of charge being determined by the processor means.

16. A method according to claim 15, wherein the battery is charged at the high rate until the amount of charge returned to the battery is substantially equal to an amount of charge computed by the processor means as having been removed from the battery before the discharge procedure was terminated or, if the discharge procedure was continued after termination pattern was detected, an amount of charge removed until the termination pattern was detected.

17. A method according to claim 15 wherein the processor means is arranged to reduce the rate of charge to a value determined by the processor means if while the battery is being charged the voltage reaches an upper limit determined by the processor means.

18. A method according to claim 17, wherein said upper limit varies in response to changes in the temperature of the battery.

19. A method as claimed in claim 10, wherein the processor means is arranged to detect a termination pattern in a graph of voltage versus time when the graph exceeds a predetermined degree of convexity where the measured battery voltage falls below a first tangent to the graph, and within a certain time thereafter, the graph exceeds a predetermined degree of concavity where the measured voltage is above a second tangent to the graph, the second tangent having been found after the detection of the required convex condition.

20. Apparatus for processing a rechargeable battery, comprising processor means for monitoring the rate of change of voltage of the battery when it is being discharged in the course of a discharge procedure in which its charge is substantially depleted and for terminating the discharge after detecting that the voltage has passed through a termination pattern determined by the processor means with reference to said rate of change, said termination pattern corresponding to a pattern indicative of exhaustion of a cell of the battery, and said processor means terminating the discharge if, before said termination pattern is detected, the voltage reaches a value substantially corresponding to a predetermined discharge termination voltage of the battery.

21. The apparatus as claimed in claim 20, wherein said processor means detects a termination pattern in a graph of voltage versus time when the graph exceeds a predetermined degree of convexity where the measured battery voltage falls below a first tangent to the graph, and within a certain time thereafter, the graph exceeds a predetermined degree of concavity where the measured voltage is above a second tangent to the graph, the second tangent having been found after the detection of the required convex condition.

22. The apparatus according to claim 20, wherein said processor means terminates the discharge procedure if, after said termination pattern is detected and before the voltage reaches said discharge termination voltage, an amount of charge determined by the processor means is removed from the battery during said discharge procedure.

23. The apparatus according to claim 20, wherein said processor means detects the termination pattern by periodically sampling the voltage and comparing changes therein to data indicative of known changes in the voltage of the battery when it is discharged under similar conditions.

24. The apparatus according to claim 20, wherein said processor means differentiates the voltage with respect to time in order to determine the rate of change of the voltage.

25. The apparatus according to claim 20, wherein said processor means causes, after the discharge procedure is terminated, charging means to recharge the battery first at a high rate and then at a lower rate, both rates of charge being determined by the processor means.

26. A method of processing a rechargeable battery comprising the steps of providing processor means which are arranged to monitor the rate of change of voltage of the battery when it is being discharged in the course of a discharge procedure in which its charge is substantially depleted and to terminate the discharge procedure after detecting that the voltage has passed through a termination pattern determined by the processor means with reference to said rate of change, said termination pattern corresponding to a pattern indicative of exhaustion of a cell of the battery, and the processor means being arranged to terminate the discharge procedure if, before said termination pattern is detected, the voltage reaches a value substantially corresponding to a predetermined discharge termination voltage of the battery.

27. A method as claimed in claim 26, wherein the processor means is arranged to detect a termination pattern in a graph of voltage versus time when the graph exceeds a predetermined degree of convexity where the measured battery voltage falls below a first tangent to the graph, and within a certain time thereafter, the graph exceeds a predetermined degree of concavity where the measured voltage is above a second tangent to the voltage graph, the second tangent having been found after the detection of the required convex condition.

28. The apparatus as claimed in claim 1, wherein said processor means detects a termination pattern in a graph of voltage versus time when the graph exceeds a predetermined degree of convexity where the measured battery falls below a first tangent to the graph, and within certain time thereafter, the graph exceeds a predetermined degree of concavity where the measured voltage is above a second tangent to the graph, the second tangent having been found after the detection of the required convex condition.

29. A method according to claim 26, wherein the processor means is arranged to terminate the discharge procedure if, after said termination pattern is detected, and before the voltage has reached said discharge termination voltage, an amount of charge determined by the processor means is removed from the battery during said discharge procedure.

30. A method according to claim 26, wherein the processor means is arranged to detect said termination pattern by periodically sampling the voltage and comparing changes therein to indicative of known changes in the voltage of the battery when it is discharged under similar conditions.

31. A method according to claim 26, wherein the processor means is arranged to differentiate the voltage with respect to time in order to determine the rate of change of the voltage.

32. A method according to claim 26, wherein the processor means is arranged, after the discharge procedure is terminated, to cause charging means to recharge the battery first at a high rate and then at a lower rate, both rates of charge being determined by the processor means.

* * * * *